United States Patent [19]

Seidel et al.

[11] Patent Number: 4,868,978
[45] Date of Patent: Sep. 26, 1989

[54] METHOD AND APPARATUS FOR EQUIPPING SUBSTRATES WITH MICROPACKS

[75] Inventors: Werner Seidel, Munich; Walter Kandler, Starnberg, both of Fed. Rep. of Germany

[73] Assignee: Siemens Aktiengesellschaft, Berlin and Munich, Fed. Rep. of Germany

[21] Appl. No.: 926,222

[22] Filed: Nov. 3, 1986

[30] Foreign Application Priority Data

Nov. 12, 1985 [DE] Fed. Rep. of Germany ....... 3540073

[51] Int. Cl.⁴ .......................................... H01R 43/00
[52] U.S. Cl. ...................................... 29/835; 29/840; 29/740; 29/743
[58] Field of Search ................. 29/740, 741, 743, 759, 29/835, 840, 564.6; 437/206, 207, 209, 220

[56] References Cited

U.S. PATENT DOCUMENTS

| | | | |
|---|---|---|---|
| 4,079,489 | 3/1978 | Kowalski et al. | 29/743 X |
| 4,236,301 | 12/1980 | Hug et al. | 29/740 X |
| 4,283,839 | 8/1981 | Gursky | 437/220 |
| 4,399,610 | 8/1983 | Moyer | 29/827 |
| 4,476,626 | 10/1984 | Gumbert et al. | 29/743 X |

Primary Examiner—Timothy V. Eley

[57] ABSTRACT

A method and apparatus for equipping micropacks on a substrate wherein the micropacks are supplied on a band from a supply reel and are cut from the band in a cut-out device. As the micropack is cut, a suction pipette or suction head of a positioning device engages the micropack as it is cut so that the orientation of the cut micropack is always known. The method and apparatus may include a bending or shaping of the external contacts of the micropack prior to the micropack being cut from the band.

18 Claims, 4 Drawing Sheets

METHOD AND APPARATUS FOR EQUIPPING SUBSTRATES WITH MICROPACKS

BACKGROUND OF THE INVENTION

The present invention is directed to a method and apparatus for equipping substrates with micropacks.

The desire for miniaturization of printed circuit boards has led to the fact that surface mounting of components, which is already standard for a long time in the film circuits, is now also being increasingly utilized with printed circuit boards.

The surface-solderable components, which are also referred to in short as SMDs in accordance with the English language term "Surface Mounted Devices" are thereby no longer plugged into holes in the board but are soldered onto the surface of the board. They require 30 to 60% less space. Since, of course, the number of plate through holes is also reduced, one can now count on a total cost reduction in the area of about 50%.

Due to the utilization of the surface mounting for printed circuit boards, the necessity occurs of developing components having modified dimensions and terminals. As a result of this development, what is referred to as a micropack arose as the smallest, flattest and lightest IC structure wherein it is a matter of an integrated circuit existing in ribbon form.

Micropacks are composed, for example, of hermetically sealed chips having solderable contacts and ribbons fashioned in the manner of film strips having tin-plated copper interconnects. A thin glass layer is deposited surface wide on the surface of the chip over the Al wiring and the contact holes of the terminals of the IC structure are then etched free. These are then inturned closed with solderable, overlapping metal layers in the form of humps. Together with the humps, the glass then yields a hermetically tight closure for the chip which is thus fully protected against environmental influences.

A 40 mm wide and 127 um thick, high temperature-resistant polyimide ribbon coated with a thin epoxy resin adhesive serves as an initial material for the manufacturing of the film strip. A window for the chip and perforation holes in accordance with the dimensions of a super-8 film are punched in this ribbon. The polyimide ribbon is then glued to a copper foil which is coated with a photoresist and is exposed with a mask mating with the IC structure. Then it is partially galvanically plated and etched so that a fine Cu terminals for the soldering of the chip and the external connections of the micropack structure, which are later required, will be present.

As a result of the flexible suspension of the IC structure in the micropack and the likewise flexible external connections, only extremely slight mechanical forces can be exerted on the chip due to the different coefficients of expansion of the various materials. This means that the surface mounting of the micropack can be unproblematicaly executed on single-layer or multi-layer substrates of ceramic, glass, epoxy resin, hard paper or polyimide foils.

Pulse-controlled contact soldering is heretofore particularly proven itself as a connecting technology for micropacks. However, reflow, condensation or laser soldering and gluing with electrically conductive adhesives are possible for use in a connecting method. However, the temperature measured at the chip should not exceed 220° C. or, respectively, 260° C. dependent on the particular embodiment.

Since micropacks are supplied in ribbon form, the external connections are first formed before the equipping. Then the micropacks are cut from the ribbon. The appropriate forming and cutting stations can be integrated in the soldering devices.

What are referred to as outer lead bonders are commercially available for processing micropacks and these operate on the same principle. A metal hoop of a pulse soldering die is heated by means of a short current pulse and the solder on the substrate board and the micropack external connections are caused to melt. Only after the solder layer has solidified is the pulse soldering die lifted off and out of contact with the connections. A risk of what are referred to as cold solder locations is thus avoided. The precise positioning of the micropacks on the substrate is undertaken under the microscope with appropriate manipulators.

Further details regarding micropacks can be derived from a company publication entitled "Mikropack eine kompakte IC-Bauform fuer die Oberflaeschenmontage", Order No. B1-B 3166, PA 05 855, S3d 3/85, published by Siemens AG, Bereich Bauelemente, Product Information, Balanstrasse 73, D-8000 Muenchen 80.

Automatic equipping units are employed for the automatic equipping of printed circuit boards or ceramic substrates with surface-solderable components, such as resistors, capacitors, diodes, transistors and the like. These automatic equipment units operate according to what is referred to as the pick and place principle. The feeding of the components is thereby based on the condition in which they are supplied. Feeder modules are available both for bulk goods and magazines, supply tapes, etc. are also available. Vibrating circular conveyor modules are particularly utilized for bulk goods and vibration longitudinal conveyor modules are employed for bar magazines and belt feeder modules are also utilized. An equipping head moves over these feeder modules and over the printed circuit boards or a ceramic substrate stationarily centered in the equipping region. This equipping head is connected to a freely programmable positioning unit having two degrees of freedom. The equipping head fitted with a suction pipette or head for picking up components and with two pairs of forceps for centering the picked up component contains three further freely programmable axes for the function of lifting and lowering the suction pipette or head, centering the components and turning the components. The equipping head picks up the components from the tracks of the feeder modules at the respective removable locations with the assistance of the suction head whereby the component respectively picked up is centered in two axial directions with the assistance of two pairs of forceps, is rotated into the integrated position and is deposited on the printed circuit board or the ceramic substrate in the intended equipping position. Subsequently, the substrates equipped in this fashion are forwarded to a reflow soldering station, whereby the surface mounting of the component is concluded, in particular, by vapor phase soldering.

U.S. Pat. No. 4,135,630, whose disclosure is incorporated by reference thereto, discloses an automatic equipping unit which works on the pick and place principle. This equipping unit comprises an equipping head equipped with a suction pipette or head and two pairs of forceps for centering the component picked up.

For the surface mounting of micropacks by means of a reflow soldering method, such as, for example, vapor phase soldering, the equipping of the micropack together with the other components should be able to be undertaken with the automatic equipping unit set forth above. The equipping of substrates with micropacks in accordance with the pick and place principle, however, is not possible without further modifications since the micropack structure is far too sensitive for centering the component picked up with the suction pipette with the assistance of the two pairs of forceps. With knowledge of the relative position between the micropack and the equipping head, however, a positionally correct placing of the micropack in the programmable equipping position is not possible.

SUMMARY OF THE INVENTION

The object of the present invention is to create a method and apparatus for automatic equipping of substrates with micropacks based on the pick and place principle.

In a method for equipping micropacks, the object is achieved in that the micropacks are taken down from a supply reel in a ribbon form, are then cut from the ribbon in a cutting device, and that the equipping head comprises a suction pipette or suction head which picks up the cut-out micropack directly from the cutting bed of the cutting device and then deposits the micropack in the prescribed equipping position on the substrate.

The inventive apparatus for equipping substrates with micropacks is characterized by a supply real from which the micropacks can be taken off in ribbon form, a cut-out device following the supply reel for cutting the micropacks out of the ribbon, said cutting device comprising a cutting punch introduceable from below into an allocated cutting bed and by an equipping head whose suction pipette or head for picking up a cut-out micropack is introduced from above into the cutting bed of the cut-out device.

The invention is based on the perception that an automatic equipping of substrates with micropacks comprises a positioning directly from the ribbon can be undertaken when the cutting bed of a cut-out device for cutting the micropacks out of the ribbon is used as a precise defined removable position for the micropacks. With the suction pipette or head, the equipping head can always pick up the cut-out micropack immediately in the cutter bed and always picks them up in the same position and orientation. With such a precise removable position in the cutter bed, then an exact positioning with the equipping position prescribed by the equipping program is then also guaranteed without additional centering of the micropacks. For the surface mounting of micropacks, thus, the same automatic equipping unit and the same soldering technology as for the remaining surface solderable components can be utilized.

In accordance with the preferred development of the invention, the ribbon taken down from the supply reel is supplied to a bending device for forming the external connections of the micropacks being supplied before the micropacks are cut from the ribbon at the cut-out device. With the bending device arranged between the supply reel and the cut-out device, thus, the forming of the external connections usually required for the surface mounting of the micropack can, thus, be undertaken without interrupting the flow of work.

In order to guarantee the exact position of the micropack in the cut-out device, positioning pins are preferably introduced into a perforation of the ribbon in the cut-out device before the micropacks are cut-out. This can be accomplished with particular low outlay when the positioning pins are actuatable together with the cutting punch.

It is provided in accordance with the further preferred development of the invention, that the cut-out micropacks are clamped in the region of the cutter bed by being clamped between the cutter punch of the cut-out and the suction pipette or head. A change in removal position due to a dislocation of the micropack within the cutter bed is thereby reliably excluded. A further increase in the positioning precision is particularly achieved in that the cut-out micropacks are pressed out of the guide region of the cutter bed by movement of the cutting punch against the resistance of the suction head or pipette.

Finally, it is also particularly advantageous for a mixed equipping of the substrate with the micropack and other components when the equipping head automatically obtains a suction pipette adaptor allocated to the micropack from a parking or storage position. The suction pipette adaptor or head is introduced into the cutter bed of the cut-out device can then be optimallly matched to the demands established for the reliable positioning.

Further advantages and objects of the present invention will be readily apparent from the following drawings, disclosure and claims.

BRIEF DESCRIPTION OF THE DRAWINGS

FIG. 8 illustrating the positioning of the suction head in the cut-out device; FIG. 9 illustrating the cutting punch moving the cut micropack into engagement with the suction head; and FIG. 10 showing the coaction of the suction head and punch for further removal of the cut micropack from the device;

DESCRIPTION OF THE PREFERRED EMBODIMENTS

Figure 3:
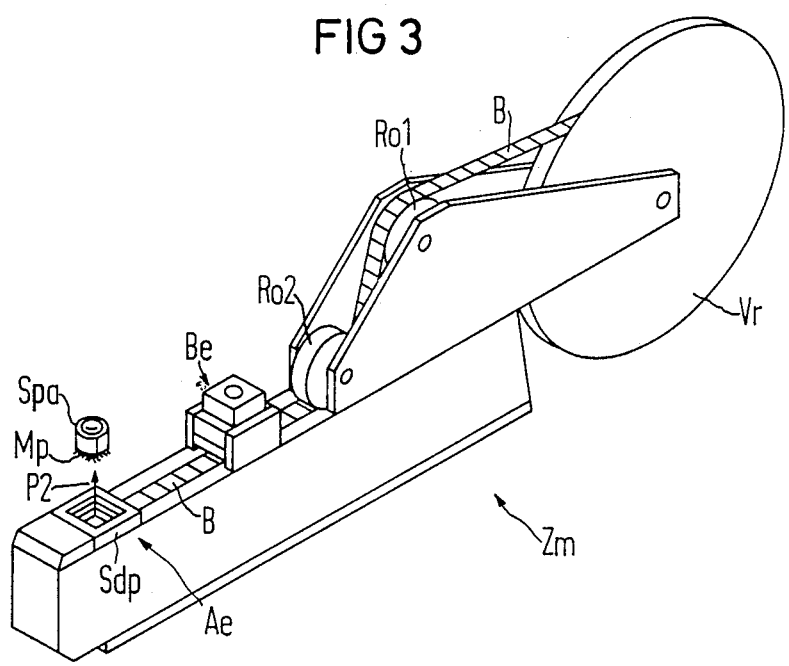
FIG. 3 is a perspective view of a feeder module for micropacks in accordance with the present invention.

The principles of the present invention are particularly useful when incorporated in a feeder module generally indicated at Zm in FIG. 3.

Figure 1:
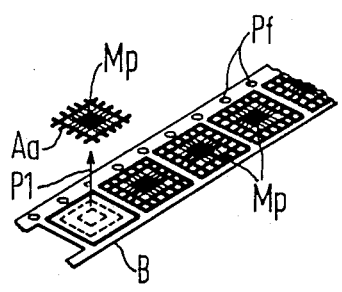
FIG. 1 is a perspective view of a ribbon from which the individual micropacks are cut-out with a micropack being removed from the ribbon.

As illustrated in FIG. 1, a band B fashioned in the manner of a film strip, which is provided with a row of perforations Pf along one lateral side, serves as a carrier for individual micropacks Mp. As indicated by an arrow P1, the individual micropacks Mp are separated from the band B, such that the individual external connections Aa project freely beyond a remaining polyimide frame.

Figure 2:
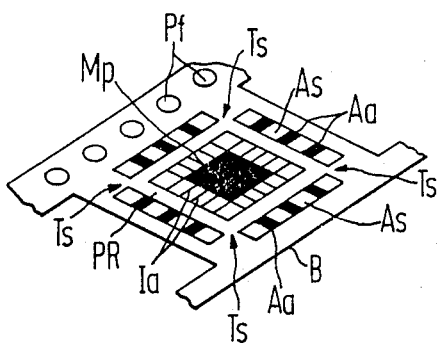
FIG. 2 is an enlarged perspective view of a micropack while carried in the ribbon of FIG. 1.

As illustrated in FIG. 2, the micropack Mp has inside or internal connections Ia, a polyimide frame Pr and external connections Aa. Four rectangular recesses As are introduced into the band B surrounding the micropack Mp and the external connections Aa project into these recesses with the spacing between the recesses at the corner regions defining connections between the polyimide frame Pr and the band B. For the cutting of the micropack Mp out of the band B, the remaining connection between the recesses As and the corner regions are merely parted. These corresponding parting locations are indicated in FIG. 2 by the arrows Ts.

The feeder module Zm for the micropacks as illustrated in FIG. 3 has a supply reel Vr containing a band B of the micropacks Mp. The band B is taken from the supply reel and travels over two rollers Ro1 and Ro2 and passes through a bending device, generally indicated at Be, for shaping the outside connections Aa. After the band passes from the bending device Be, it is supplied to a cut-out device, generally indicated at Ae, of which only the cutter bed Sdp lying at the top may be seen. As also illustrated in FIG. 3, the cutter bed Sdp forms the removal position for the micropacks Mp which are cut from the band B and the micropacks Mp are withdrawn in the direction of arrow P2 by the assistance of a suction pipette or head Spa.

Figure 4:
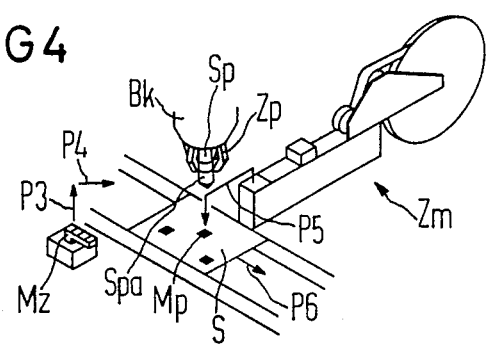
FIG. 4 is a perspective view illustrating the positioning of a feeder module of FIG. 3 with an automatic equipping unit.

As schematically illustrated in FIG. 4, the feeder module Zm is positioned with an automatic equipping unit for equipping substrates S with surface solderable components. Given this automatic equipping unit, the substrate S, which, for example, can be a printed circuit board, is stationarily centered in an equipping region. The feeder module Zm will offer the micropacks Mp and other feeder modules, which are not shown, will offer other surface solderable components which are to be laterally disposed on the substrate S. An equipping head Bk moves over these rigidly constructed units and the equipping head is mounted to a freely programmable positioning unit having two degrees of freedom (which unit is not shown in the drawings). With a suction pipette or head Sp, the equipment head Bk moves the component from the tracks of the corresponding feeding module, centers the component in two axial directions by actuating two pairs of forceps Zp, turns the component which has been picked up and centered into an integrated position as needed and then places a component onto the prescribable equipping position of the substrate S. For the equipping of micropacks Mp, the equipping head Bk first automatically retrieves a suction pipette adaptor or head Spa, which is matched to the micropack Mp, from a laterally arranged storage magazine Mz as indicated by the arrow P3 and P4. With the suction pipette adaptors Spa, the micropacks Mp are then removed from the feeder module Zm and are deposited into the perscribed equipping position on the substrate S as indicated by the arrow P5. After the complete equipping with micropacks Mp and the other surface solderable components, the substrates S are then carried off in the direction of the arrow P6 for finishing the surface mounting by means of a reflow soldering method and in particular, by means of a vapor phase soldering.

As mentioned hereinbefore, prior to being cut from the band, each of the micropacks passes through a bending device Be of the feeder module Zm to have the desired bend placed on the external connectors. The bending device Be is composed of a stationarily arranged bending die or swage Bg and a raisable and lowerable bending punch Bs. In accordance with FIG. 5, the band B having individual micropacks Mp is conveyed forward in steps in the direction of the arrow P7 such that the respective next micropack Mp whose outside connectors Aa are to be shaped is precisely arranged in the proper position between the upper bending die Bg and the lower bending punch Bs. For the shaping of the outside connector Aa, the bending punch Bs is then moved up in the direction of the arrow P8 whereby the parts of the micropack Mp which are not to be deformed are received in correspondingly provided recesses of the bending punch Bs and of the swage or die Bg.

Figure 7:
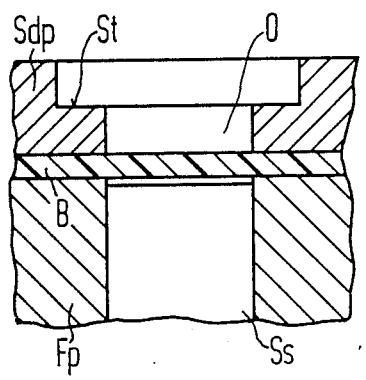
FIGS. 7-10 are cross sectional views with portions in elevation for purposes of illustration showing various stages of the cutting and removal of micropacks in the feeder module of FIG. 3 with FIG. 7 being an illustration of the ribbon disposed in the cutting device.

The step of cutting the micropack Mp from the band B will be described in accordance with FIGS. 7 and 8 which show various stages of both the cutting out of the micropack and also of the removal of the micropack from the cut-out device. The cutter bed Sdp, already shown in FIG. 3, and an upwardly movable punch Ss, which is guided in a guide plate Fp, are the parts of the cut-out device which can be seen in FIG. 7. The band B is situated between the cutter bed Sdp and the guide plate Fp and this band is moved in steps in the direction perpendicular to the plane of the drawing. The cutter bed Sdp has an opening O, which is dimensioned such that the cutting punch Ss can penetrate and this opening O is expanded somewhat toward the top with a step St.

Figure 8:
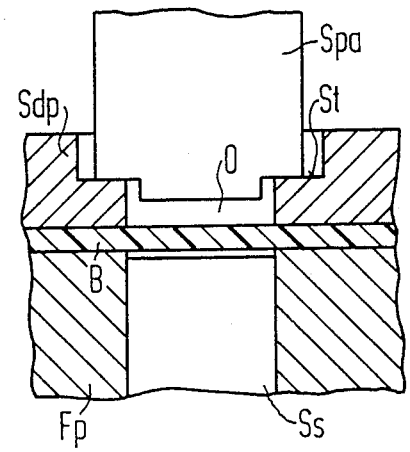
Figure 9:
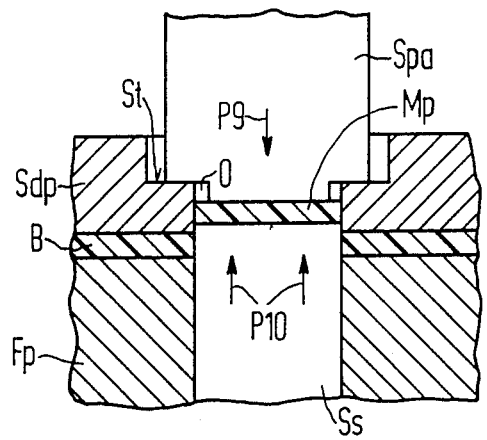
Figure 10:
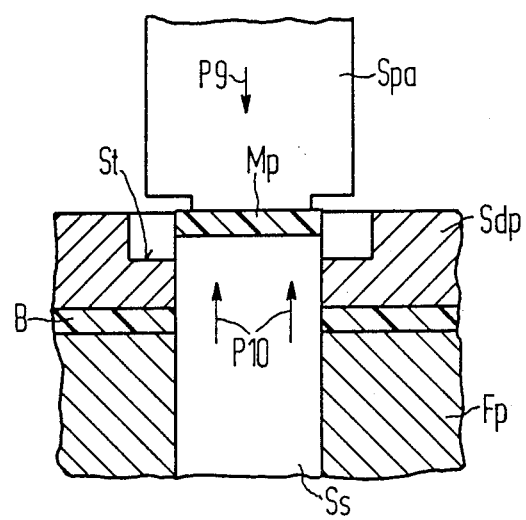

As illustrated in FIG. 8, the suction pipette or adaptor head Spa, which is attached to the suction pipette Sp of the equipping head Bk, is first introduced into the opening O of the cutter bed Sdp so that a step of the adaptor Spa rests on the step St of the opening O. As illustrated in FIG. 9, the cutting punch Ss is then subsequently moved up so that the micropack Mp (which is only shown schematically in these FIGS.) is cut-out of the band B and is clamped between the cutting punch Ss and the suction pipette adaptor Spa. The pressure indicated by the arrow P9 with which the suction pipette adaptor Sp is pressed down is thus less than the pressure indicated by the two arrows B10 with which the cutting punch Ss is pressed upwardly. Consequenlty, as shown in FIG. 10, the suction pipette adaptor Spa is then lifted off of the step St and the cut-out micropack Mp is pressed up out of the opening O beyond the step St. The suction pipette adaptor Spa then lifts the micropack Mp off the top of the punch Ss and upward from the bed Sdp so that it can be moved and be deposited on the substrate S which is to be equipped as mentioned with regard to FIG. 4.

It may be seen from FIGS. 7-10, that the micropack Mp cut from the band B is initially still guided in the opening O of the cutter bed Sdp. As a result of this guidance of the cut-out micropack Mp in the cutter bed Sdp, a precisely defined initial position will occur. This will enable a reliable positioning of the micropack Mp on the substrate S which is to be equipped with the micropack.

Figure 11:
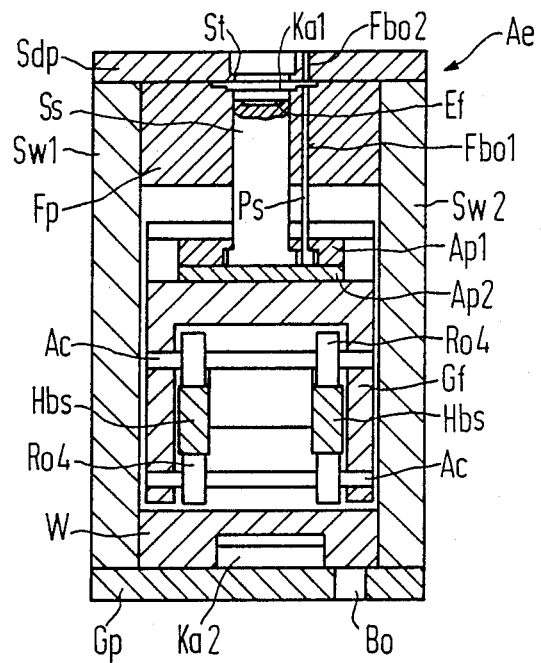
FIG. 11 is a transverse cross section with portions in elevation for purposes of illustration of the cut-out device of the module of FIG. 3.
Figure 12:
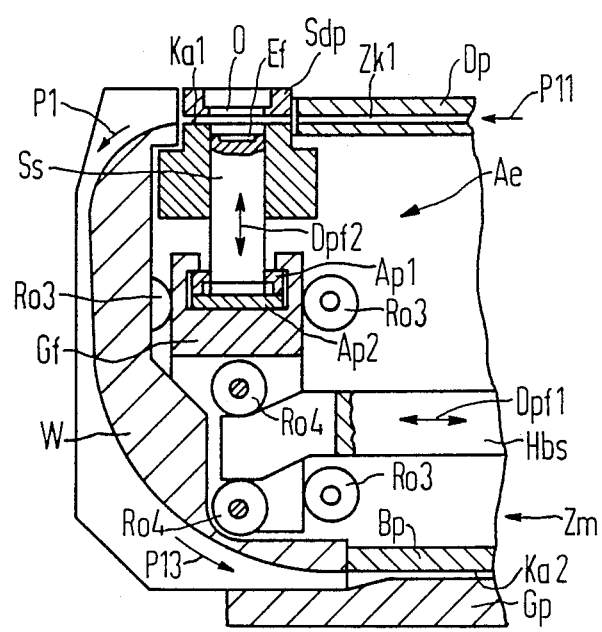
FIG. 12 is a longitudinal cross sectional view with portions in elevation for purposes of illustration of the cut-out device in accordance with the present invention.

A detailed construction of the cut-out device Ae of the feeder module Zm is illustrated in FIGS. 11 and 12. As illustrated, the cut-out device Ae has two straight lateral walls Sw1 and Sw2, which are located between the cutter bed Sdp arranged at the top and a lower base plate Gp, and a front end wall W, which has a curved configuration (see FIG. 12). The device has a cover plate Dp with a feed channel Zk1 for the feed of the band B in the direction of arrow P11 and the cover plate Dp extends from the cutter bed Sdp toward the reel Vr. The two lateral side walls Sw1 and Sw2 and the base plate Gp extend towards the back over the overall length of the feeder module Zm.

The feeder channel Zk1 is followed by a channel Ka1 which is located between the cutter bed Sdp and the guide plate Fp of the cutter punch Ss. The channel Ka1 is formed by a flat milling of the guide plate Fp which is adapted to the shape of the particular band B. After the micropack Mp has been cut-out, the band B is guided out of the channel Ka1, is deflected around the curved wall W as illustrated by the arrows P12 and P13 and is then carried off through a channel Ka2 which extends between the base plate Gp and a thinner bottom plate Bp of the feeder module Zm (see FIG. 12).

As illustrated in FIG. 11, a bore Bo is provided in the base plate Gp and fits a pin to engage and orient the feed module Zm on an automatic equipping unit. Moreover, the feed module Zm is held on the table of the automatic equipping unit on the basis of its own dead weight and by magnetic forces.

At the upper side, the cutting punch Ss is provided with a milled in portion or recess Ef, which is dimensioned such that it can accept the thicker IC structure region of the micropack Mp and protect it against damage during the cut-out process. Moreover, the cutting punch Ss, of course, needs only cut the parting locations Ts shown in FIG. 2. The cutting punch Ss is fastened in a punch holder which is composed of an upper holding plate Ap1 and of a lower holding plate Ap2 and which is held with a positive lock in a straight line mechanism Gf. The vertical guidance of this straight line mechanism Gf occurs by means of a plurality of rollers Ro3 (FIG. 12) whereas the rollers Ro4 are mounted in a straight line mechanism Gs by means of shaft Ac. A lifter rod Hbs is movable in a back and forth fashion in a horizontal direction in accordance with the double arrow Dpf1 and provides a reciprocating vertical movement of the punch Ss. In its front region, the lifted rod Hbs is forked and is crimped such that its horizontal reciprocating motion Dpf1 is converted into a reciprocal up and down motion for the cutting punch Ss in accordance with the double arrows Dpf2.

Figure 5:
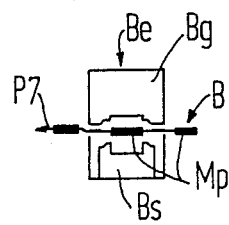
FIGS. 5 and 6 are schematic presentations illustrating the operation of a bending device utilized in a feeder module of FIG. 3 with FIG. 5 showing the bending device in an open position and FIG. 6 illustrating the device in a closed position.
Figure 6:
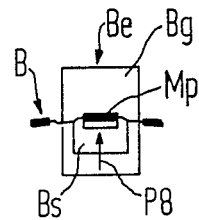

The lifter rod Hps is driven via a crank drive which is not illustrated in the drawings and also serves the purpose of driving the bending device Be, such as illustrated in FIGS. 3, 5 and 6. Thus, the lifter rods Hps will cause the bending punch Bs to be moved up and down to create the bending action. The lifter rods Hbs also actuate a driving means arranged between the bending device Be and the cut-out device Ae and this drive means or unit, by engagement into the perforations Pf of the band B, move the band B forward in steps in the direction of the arrow P11 so that a respective micropack Mp is arranged exactly above the bending punch Bs and also above the cutting punch Ss. The drive unit, which is not shown in the drawings, can be constructed like the drive units employed in film cameras for the step-by-step transport of film.

When the band B is transported forward in the direction of the arrow P11 until the next micropack Mp is arranged in the cut-out device Ae, then a fine positioning is also undertaken before the actual cut-out process. This fine positioning guarantees an extremely precise and reproducible relative position between the micropack Mp and the cut-out device Ae. This fine positioning occurs with the assistance of two positioning pins Ps arranged at a distance from one another which pins are secured in the punch holder composed of the holder plate Ap1 and Ap2 and which are guided in guide bores Fbo1 of the plate Fp. The positioning pins Ps are thus actuated together with the cutting punch Ss. The length of the positioning pins Ps is dimensioned so that they are introduced into the perforations Pf of the band B shortly before the micropack Mp is cut-out and thereby affect a fine positioning with the exact relative position of the micropack Mp and cutting punch Ss or, respectively, cutter bed Sdp. When the micropack Mp is cut-out, the positioning pins Ps then penetrate into corresponding guide bores Fbo2 of the cutter bed Sdp.

As a result of the fine positioning set forth above, the cut-out micropack Mp always assumes the same position within the opening O of the cutting bed Sdp. In accordance with the schematic illustration in FIGS. 7-10, the opening O of the cutter bed Sdp is then employed as a removal position for the micropacks Mp. Thus, there is a defined initial position and the micropacks can then be placed exactly into the program equipment position of the substrate S of FIG. 4 by the equipping head Bk. Mechanical damage or other degradation of the micropacks Mp will not occur.

Although various minor modifications may be suggested by those versed in the art, it should be understood that we wish to embody with the scope of the patent granted hereon, all such modifications as reasonably and properly come within the scope of our contribution to the art.

We claim:

1. A method for equipping substrates with micropacks at a prescribed position, said method comprising providing a module receiving a band of micropacks and having a cutter bed with a cutting station with a punch; providing an equipment head having a suction pipette, said equipment head being movable along a first direction into and out of the cutter bed and in a plane extending perpendicular to the first direction; advancing a band containing the micropacks into the cutter bed to position the micropack at the cutting station; cutting a micropack from the band by raising the punch upwardly into the cutter bed; removing the cut micropack from the cutter bed with the suction pipette as the micropack is cut from the band by raising the suction pipette upwardly from the cutter bed in the first direction; then moving said pipette in said plane to move the cut micropack in a second direction perpendicular to the first direction from the cutting station to a position over the prescribed position on the substrate; and then placing the cut micropack on the substrate at said prescribed position.

2. A method according to claim 1, which includes prior to cutting the micropacks from the band, subjecting each of the micropacks to a shaping operation to shape the outside connections of the micropack prior to the micropack being cut from said band.

3. A method according to claim 2, wherein the band of micropacks has a row of perforations along one edge, and said step of cutting includes inserting positioning pins in the row of perforations to make a fine positioning of the band with the micropacks prior to the cutting step.

4. A method according to claim 1, wherein during the step of cutting the micropacks, placing the suction pipette above the micropacks to clamp the micropacks between the cutting punch and the suction pipette as the micropacks are separated from the band.

5. A method for equipping substrates with micropacks at a prescribed position, said method comprising providing a module receiving a band of micropacks and having a cutter bed with a cutting station with a punch; providing an equipment head having a suction pipette, said equipment head being movable along a first direction and in a plane extending perpendicular to the first direction; advancing a band containing the micropacks into the cutter bed to position the micropack at the cutting station; cutting a micropack from the band, said cutting including placing the suction pipette above the micropacks to clamp the micropacks between the cutting punch and the suction pipette as the micropacks are separated from the band and raising the cut micropack with the punch and pipette out of a guide region of the cutting bed; then lifting the cut micropack by the suction pipette from the cutting bed in the first direction; moving the cut micropack in a second direction from the cutting station by transporting said pipette in said plane to a position over the prescribed position on the substrate; and then placing the cut micropack on the substrate at said prescribed position.

6. A method according to claim 1, wherein the step of providing an equipment head includes providing an equipment head having a suction pipette adaptor constructed to the shape of the micropack being removed from the band.

7. An apparatus for equipping substrates with micropacks, said apparatus including means for holding a substrate in a fixed position and an equipment head with a suction pipette and a frame supporting a supply reel containing a band having the micropacks, a cut-out device mounting on said frame for cutting micropacks out of the band, said cutting device including a cutting bed resting on said band and a punch movable upward through the band into the bed to cut the micropack from the band, means mounting the equipment head with the suction pipette for movement in three directions with said suction pipette being introducible in a first direction from above into the cutting bed of the cut-out device for pick-up and subsequent removal of the cut-out micropacks and then being moved laterally in one of the other directions to position the cut-out micropack in a prescribed position on the substrate.

8. An apparatus according to claim 7, which further includes a bending device positioned between the supply reel and the cut-out device, said bending device having means for shaping the outside connections of the micropacks on said band.

9. An apparatus according to claim 8, wherein the band has a plurality of perforations along one edge thereof and said apparatus includes at least two positioning pins adjacent the cut-out device for introduction into said perforations during the cutting operation.

10. An apparatus according to claim 9, wherein the positioning pins are actuatable together with the punch.

11. An apparatus according to claim 10, wherein the frame holding the supply reel and the cut-out device are arranged as interchangeable feeder module separate from a frame supporting the equipping head.

12. An apparatus according to claim 11, wherein the bending device is positioned on said sub-frame forming the feeder module.

13. An apparatus according to claim 11, wherein the equipping head includes a magazine containing at least one suction pipette adaptor, said adaptor being shaped to the particular micropack being handled.

14. An apparatus according to claim 7, wherein the band of micropacks has perforations along one edge thereof, and said apparatus includes positioning pins introduceable into the perforations adjacent the cut-out device.

15. An apparatus according to claim 14, wherein the positioning pins are actuatable with the punch.

16. An apparatus according to claim 14, wherein the cut-out device and supply reel are mounted on a sub-frame forming an interchangeable feeder module.

17. An apparatus according to claim 7, wherein said means for holding the substrate including means for conveying the substrate in a path extending substantially perpendicularly to the direction of movement of said band to the cut-out device.

18. An apparatus according to claim 17, which further includes a bending device positioned between the supply reel and the cut-out device, said bending device having means for shaping the outside connections of the micropacks on said band.

* * * * *